US006964005B2

(12) United States Patent
Hollums

(10) Patent No.: US 6,964,005 B2
(45) Date of Patent: Nov. 8, 2005

(54) SYSTEM AND METHOD FOR INTERLEAVING DATA IN A COMMUNICATION DEVICE

(75) Inventor: Scott Hollums, Duluth, GA (US)

(73) Assignee: Broadcom Corporation, Irvine, CA (US)

( * ) Notice: Subject to any disclaimer, the term of this patent is extended or adjusted under 35 U.S.C. 154(b) by 481 days.

(21) Appl. No.: 10/162,062

(22) Filed: Jun. 5, 2002

(65) Prior Publication Data

US 2002/0188905 A1 Dec. 12, 2002

Related U.S. Application Data

(60) Provisional application No. 60/296,452, filed on Jun. 8, 2001.

(51) Int. Cl.[7] ............................................ H03M 13/00
(52) U.S. Cl. ...................... 714/752; 714/762; 711/157
(58) Field of Search .............................. 714/752, 762, 714/702; 711/157

(56) References Cited

U.S. PATENT DOCUMENTS

| 5,063,533 | A |   | 11/1991 | Ernhart et al. ............... 395/425 |
| 5,737,337 | A | * | 4/1998  | Voith et al. .................. 714/702 |
| 5,828,671 | A |   | 10/1998 | Vela et al. .................... 371/2.1 |
| 6,118,745 | A | * | 9/2000  | Hutchins et al. ......... 369/59.19 |

FOREIGN PATENT DOCUMENTS

FR    2 703 859 A1    10/1994

OTHER PUBLICATIONS

International Search Report from PCT Application Serial No. PCT/US 02/17820, filed Jun. 6, 2002, 8 Pages (Search Report mailed Sep. 13, 2002).

* cited by examiner

Primary Examiner—Phung My Chung
(74) Attorney, Agent, or Firm—Sterne Kessler Goldstein & Fox PLLC

(57) ABSTRACT

A system and method is provided for interleaving data in a communication device. The system includes a memory that stores blocks of data to be interleaved. In addition to the memory, the system includes a write module and a read module, each of which is coupled to the memory. The write module is configured to receive a burst of data and write blocks of data from the burst into the memory. The write module is also configured to provide control information to the read logic. The control information includes a rolling burst counter and a burst profile bank identifier for each block. If interleaving is activated, the control information also includes information pertaining to how the read module should interleave the block. If interleaving is not activated, the control information also includes the byte length size of the burst. The read module reads blocks of data from memory in either an interleaved fashion or a non-interleaved fashion in accordance with the control information. A block available signal and a block out signal is also provided to determine when a block of data is available to be read from the memory.

25 Claims, 10 Drawing Sheets

| | | | | | | | | |
|---|---|---|---|---|---|---|---|---|
| X11 | X12 | X13 | ⋮ | X1k | X1l | X1m | ⋮ | X1N |
| X21 | X22 | X23 | ⋮ | X2k | X2l | X2m | ⋮ | X2N |
| X31 | X32 | X33 | ⋮ | X3k | X3l | X3m | ⋮ | X3N |
| X41 | X42 | X43 | ⋮ | X4k | X4l | X4m | ⋮ | X4N |
| X51 | X52 | X53 | ⋮ | X5k | | | | |

FIG. 7

SYSTEM AND METHOD FOR INTERLEAVING DATA IN A COMMUNICATION DEVICE

CROSS REFERENCE TO RELATED APPLICATIONS

This application claims priority to provisional U.S. Application Ser. No. 60/296,452, entitled "System and Method for Writing Data in an Interleaver RAM," filed Jun. 8, 2001, which is incorporated by reference in its entirety as if set forth fully herein.

BACKGROUND OF THE INVENTION

1. Field of the Invention

The present invention is generally related to communication networks. More particularly, the present invention is related to systems and methods for interleaving data in communication devices.

2. Related Art

As in other communications systems, cable modem systems may be subject to intermittent, random bursts of noise, often referred to as burst noise or impulse noise. When such a noise burst occurs, it may introduce errors into packets of information transmitted over the system. In some cases, these errors may be corrected by Forward Error Correction (FEC). The ability of FEC to correct errors may be further enhanced through the use of interleaving. FEC is the ability of a receiving station to correct a transmission error in a data burst. To enable FEC, the transmitting station appends information to the data in the form of error correction bits. For example, Hamming codes provide for FEC using a "block parity" mechanism. Generally, use of the "block parity" may allow the correction of single bit errors and detection of two bit errors per unit of data. Other code types may be used to implement FEC as well.

For example, Reed Solomon (RS) error correction is another frequently used FEC error correction technique in which parity bits are added to a group of data bits to produce what is known as a codeword. Each codeword is capable of correcting only a certain number of data errors in the data represented by the codeword. For example, codeword A may be capable of correcting five data errors in the data represented by the codeword. If a particular noise burst occurs which causes eight data errors in the data, for example, only five data errors may be corrected by the Reed Solomon technique. Thus, three data errors in the data will remain.

In an attempt to extend the effectiveness of FEC error correction techniques such as Reed Solomon encoding, a codeword byte reordering process known as interleaving may be performed. Interleaving is a process of reordering symbols or bytes in a group of transmitted codewords such that adjacent symbols or bytes in the data stream are not from the same codeword. The interleaving process aids in reducing effects of burst errors (for example, multiple consecutive errors in data represented by a codeword) because rearranging the codeword symbols or bytes distributes the errors among multiple codewords. With further reference to the example above, the data represented by codeword A may also be represented by codeword B (that is, codeword A may represent a portion of the data, and codeword B may represent a portion of the data). Codewords A and B may be composed of ten bytes each.

Instead of transmitting the codewords in byte order such that the first byte of codeword A is followed by the second byte of codeword A, and so on, interleaving may be used to transmit the first byte of codeword A, followed by the first byte of codeword B, followed by the second byte of codeword A, followed by the second byte of codeword B, and so on, until all bytes of the codewords are transmitted.

In this scheme, if a noise burst occurs spanning eight codeword bytes, it will affect four bytes of codeword A and four bytes of codeword B. Thus, the maximum data errors capable of being corrected by the codewords will not likely be exceeded, and the effectiveness of the Reed Solomon technique is extended.

FIG. 1 illustrates a conventional system 100 for interleaving data in a communication device. For example, system 100 may be implemented in a conventional cable modem. Interleaving is typically employed with the use of two separate memory devices memory 115 and memory 120, as illustrated in FIG. 1. System 100 also comprises write module 105, which receives data from an encoder, such as an RS encoder, and alternately writes it in blocks to memory 115 and memory 120, and read module 110, which reads blocks of data alternately from memory 115 and memory 120 in an interleaved fashion.

In the conventional interleaver system 100, write module 105 and read module 110 are not permitted to read and write to the same memory device at the same time. Rather, while write module 105 writes a block to memory 115, read module 110 reads a block from memory 120. Similarly, while write module 105 writes a block to memory 120, read module 110 reads a block from memory 115. By alternating reads and writes in this fashion, the interleaver system of FIG. 1 ensures that the write module 105 will never overwrite data stored in memory that has not yet been read by read module 110.

This "ping pong" technique also avoids processing delays in a communication system where blocks are of a fixed size. In such a system, the time required for the write module 105 to write a block and the time required for the read module 110 to read a block will be known quantities. Consequently, alternating reads and writes to memories 115 and 120 may be synchronized such that the amount of time write module 105 has to wait for read module 110 to finish reading from memory in order to begin writing and, conversely, the amount of time that read module 110 has to wait for write module 105 to finish writing to memory in order to begin reading, may be minimized.

However, the above-described system may incur processing delays in a system where blocks may be of a variable size. For example, in such a system, write module 105 may be required to write a short block to memory 115 while read module 110 is reading a longer block from memory 120. In this case, the write module 105 will finish operating in advance of read module 110. As a result, write module 105 must remain idle until read module 110 has completed reading the longer block from memory 120. Alternatively, read module 110 may be required to read a short block from memory 115 while write module 105 is writing a longer block to memory 120. In this case, read module 110 will finish operating in advance of write module 105. Consequently, read module 110 must remain idle until write module 105 has finished writing the longer block to memory 120. When write module 105 or read module 110 are idled, system throughput as well as the efficiency of data transmission from the communication device is decreased.

Therefore, what is needed is a system and method for interleaving data that avoids unnecessary delays in a system that permits variable-sized blocks, thereby increasing system throughput and efficiency of data transmission.

BRIEF SUMMARY OF THE INVENTION

The present invention is directed to a system for interleaving data in a communication device. In accordance with embodiments of the present invention, the system includes a memory, which may comprise a circular buffer, that stores blocks of data to be interleaved. In addition to the memory, the system includes a write module and a read module coupled to the memory. The write module is adapted to write blocks of data into the memory and provide control information to the read module, including a burst profile bank identifier and a rolling burst count.

Where interleaving is activated, the control information further includes an interleave depth, and a length for a last FEC codeword. The read module interleaves blocks of data in accordance with this control information by reading blocks of data out of the memory in a different order than they were written to the memory. When interleaving is not activated, in addition to the burst profile bank identifier and the rolling burst count, the control information further includes a byte length for the block of data. In this situation, instead of reading blocks of data out of the memory in an interleaved fashion, the read module reads blocks of data out of the memory in the same order in which they were written. In either case, the control information enables the read and write modules of the present invention to share a single memory unit.

A system in accordance with embodiments of the present invention further includes a block available signal for indicating to the read module when a block of data is available for reading and a block out signal for indicating to the write module that a block of data has been read from the memory. The read module also maintains a clear read pointer for preventing the write module from overwriting unread data in the memory. The above-described signals enable the write module to continuously write as many blocks into the memory as can be accommodated therein and enable the read module to continuously read as many blocks of data as are available in the memory. Thus, unnecessary delays are minimized in systems where the block size of the data is variable. As a result, optimal throughput and efficiency of the system is realized.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the pertinent art to make and use the invention.

FIGS. 3A, 3B, 3C and 3D collectively depict a flowchart of a method for writing blocks of data into a memory in accordance with embodiments of the present invention.

Figure 4A:
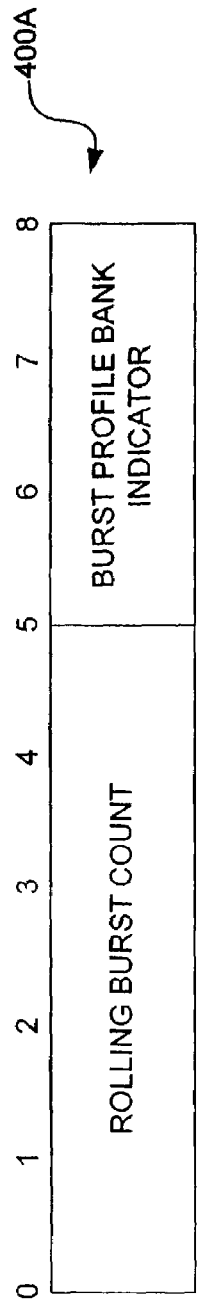

FIG. 4A illustrates an example format of a first input prepend byte of control information in accordance with embodiments of the present invention.

Figure 4B:
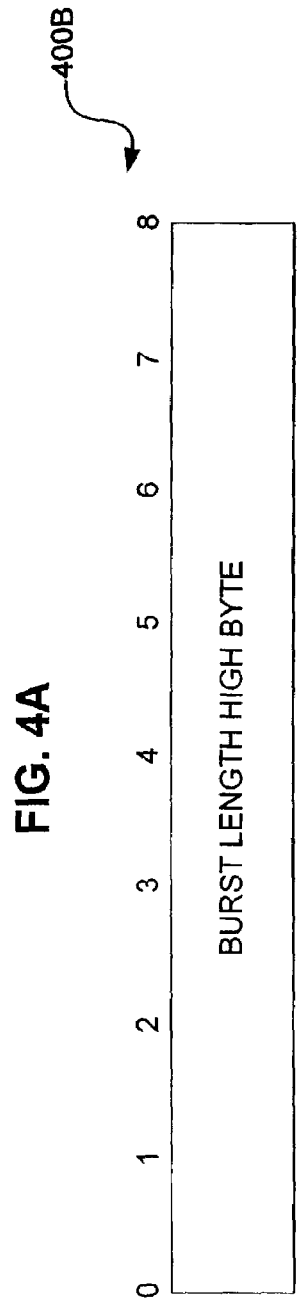

FIG. 4B illustrates an example format of a second input prepend byte of control information in accordance with embodiments of the present invention.

Figure 4C:
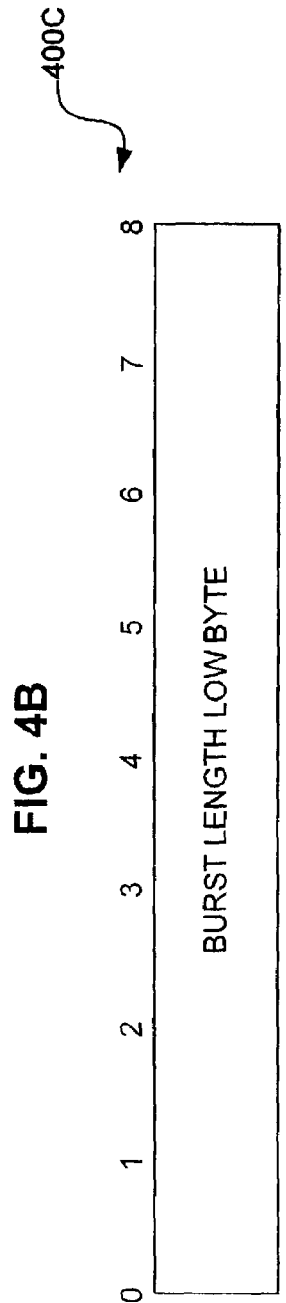

FIG. 4C illustrates an example format of a third input prepend byte of control information in accordance with embodiments of the present invention.

Figure 5A:
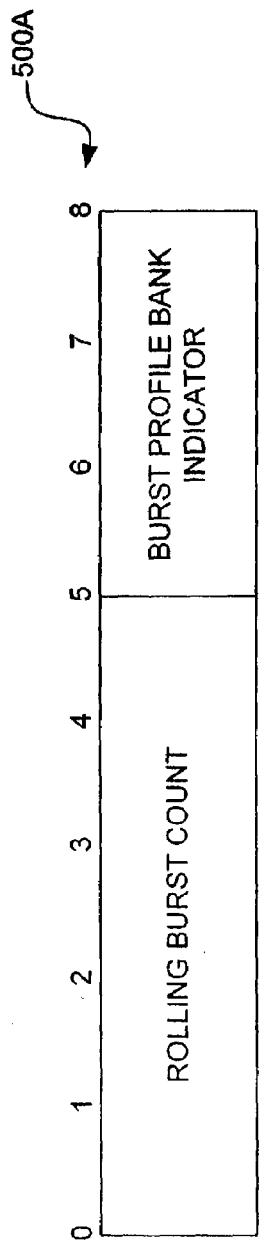

FIG. 5A illustrates an example format of a first output prepend byte of control information in accordance with embodiments of the present invention.

Figure 5B:
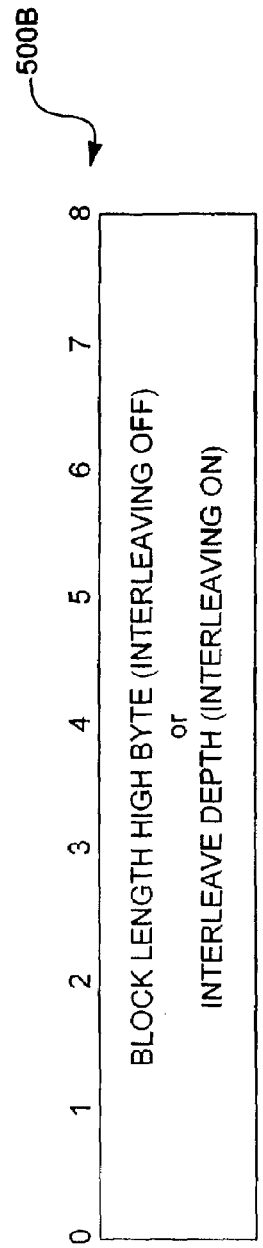

FIG. 5B illustrates an example format of a second output prepend byte of control information in accordance with embodiments of the present invention.

Figure 5C:
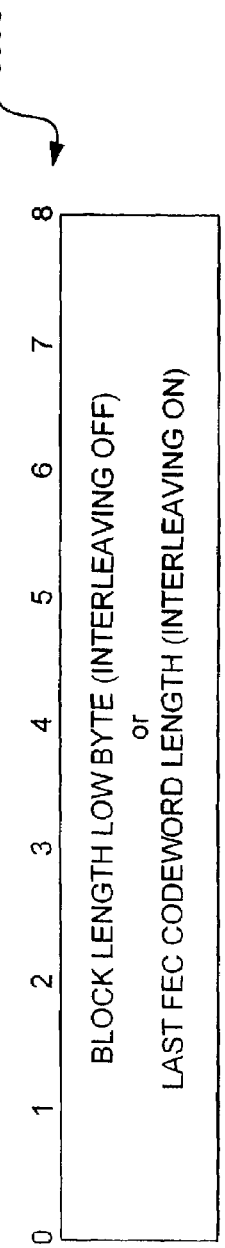

FIG. 5C illustrates an example format of a third output prepend byte of control information in accordance with embodiments of the present invention.

Figure 6:
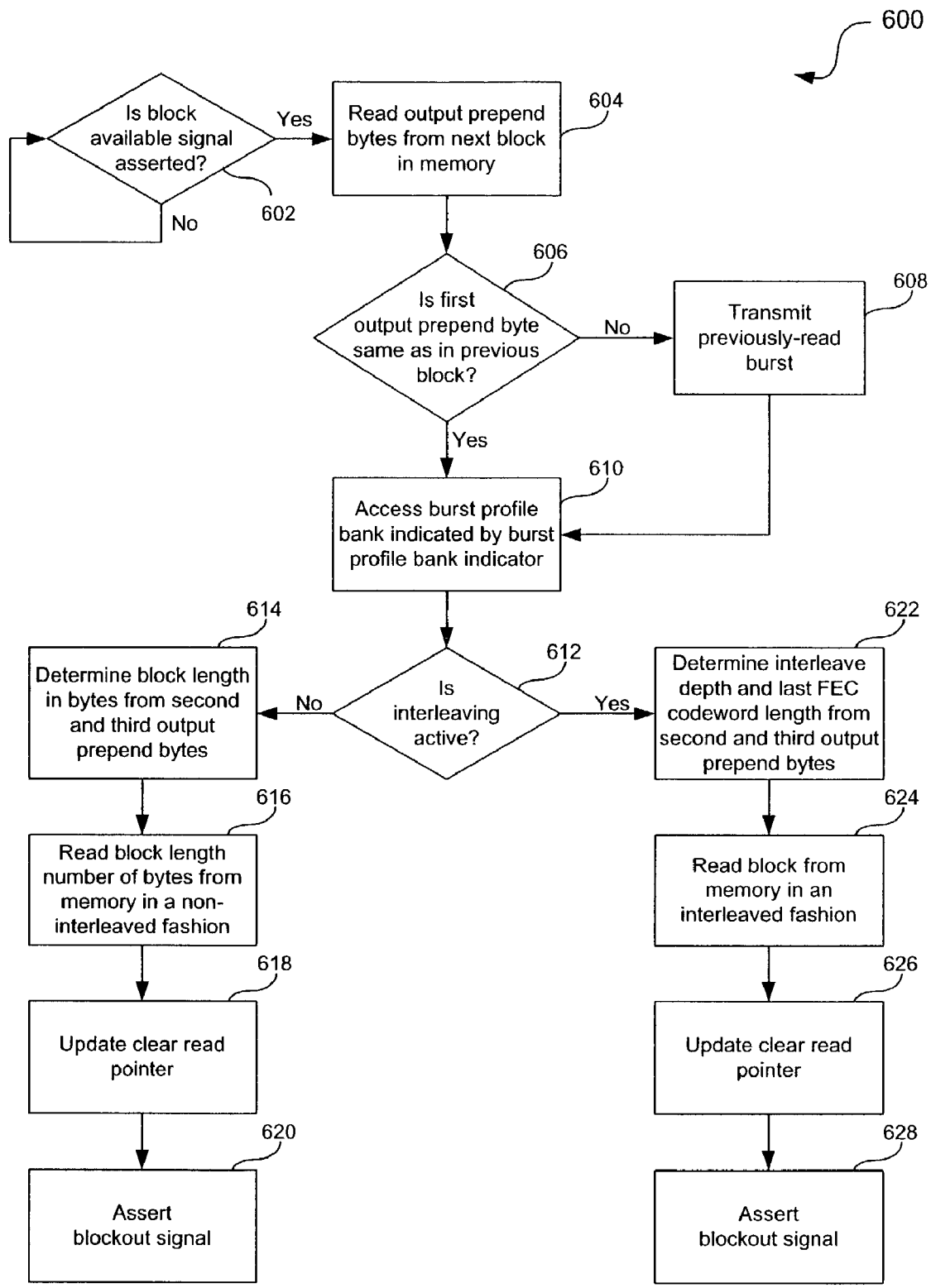

FIG. 6 is a flowchart illustrating a method for reading and interleaving blocks of data from a memory in accordance with embodiments of the present invention.

FIG. 7 is a diagram illustrating interleaving of exemplary blocks of data in accordance with embodiments of the present invention.

The features and advantages of the present invention will become more apparent from the detailed description set forth below when taken in conjunction with the drawings in which like reference characters identify corresponding elements throughout. In the drawings, like reference numbers generally indicate identical, functionally similar, and/or structurally similar elements. The drawings in which an element first appears is indicated by the leftmost digit(s) in the corresponding reference number.

DETAILED DESCRIPTION OF THE INVENTION

While the present invention is described herein with reference to a cable modem system, it should be understood that the invention is not limited thereto. Those skilled in the art with access to the teachings provided herein will recognize that embodiments of the present invention may be practiced in a wide variety of communication systems. For example, embodiments of the present invention may be implemented in any communication system in which electronic information is transmitted in packets.

Figure 2:
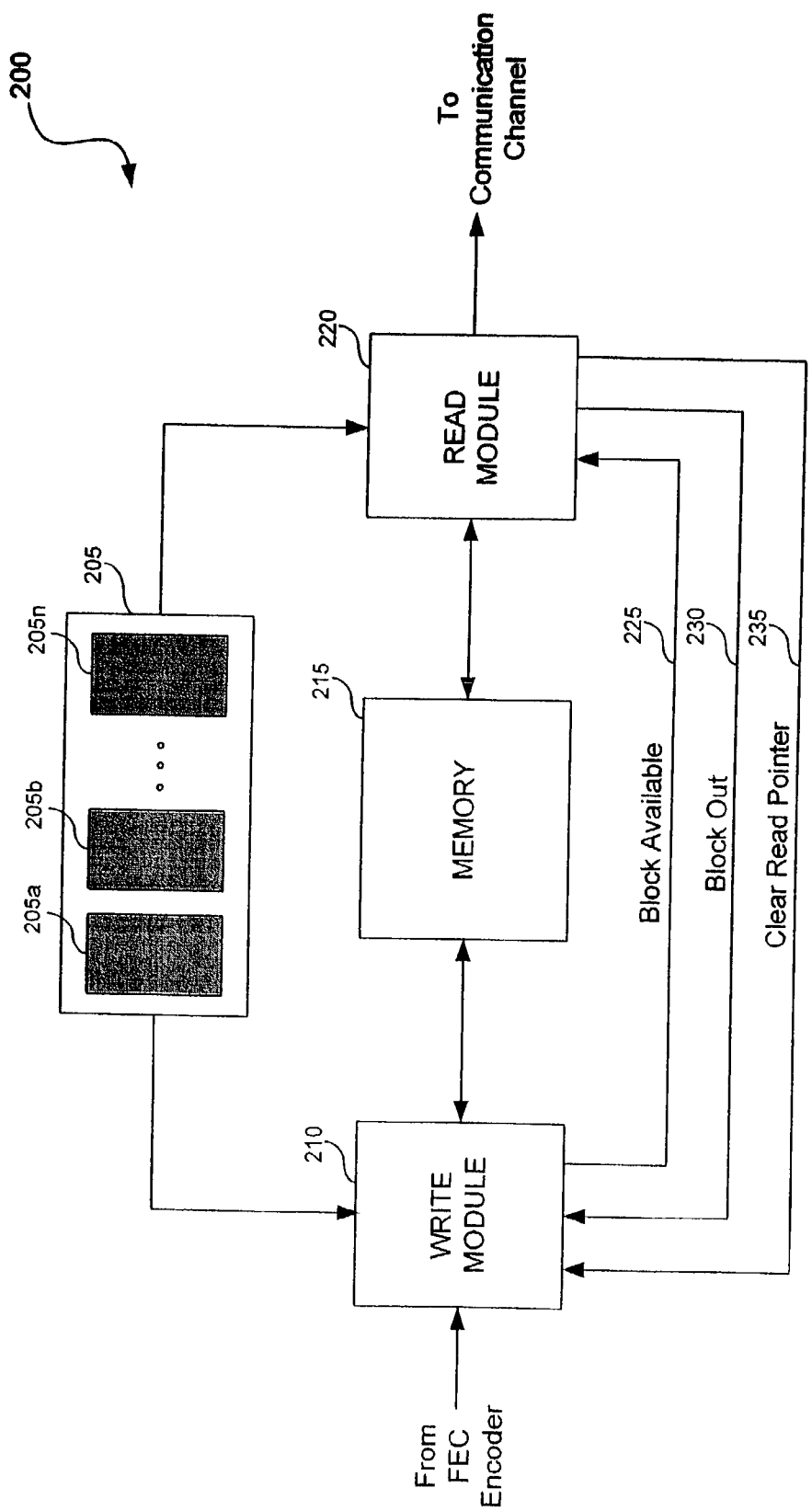
FIG. 2 is a block diagram of a system for interleaving data in a communication device in accordance with embodiments of the present invention.
Figure 3A:
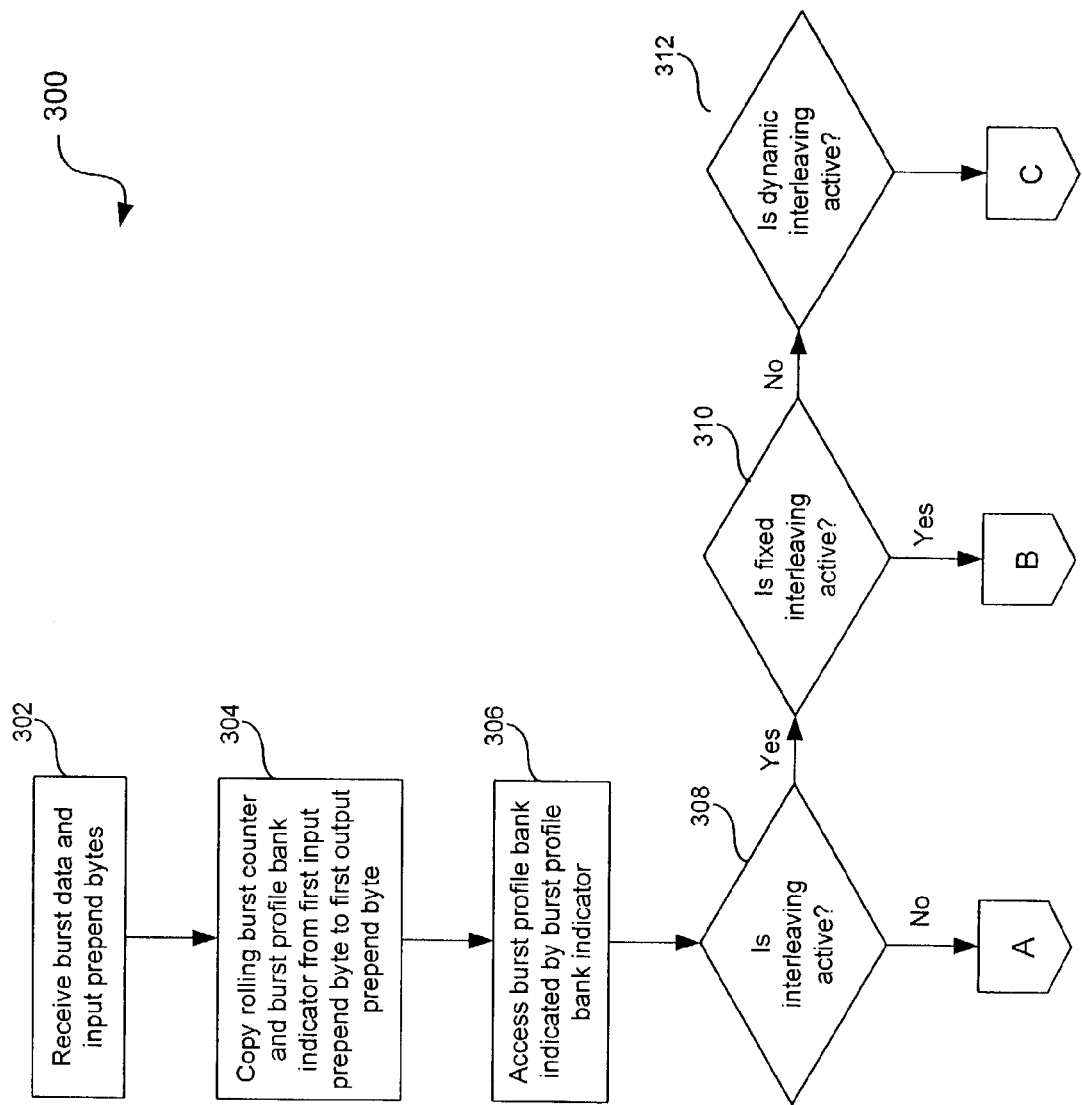
Figure 3B:
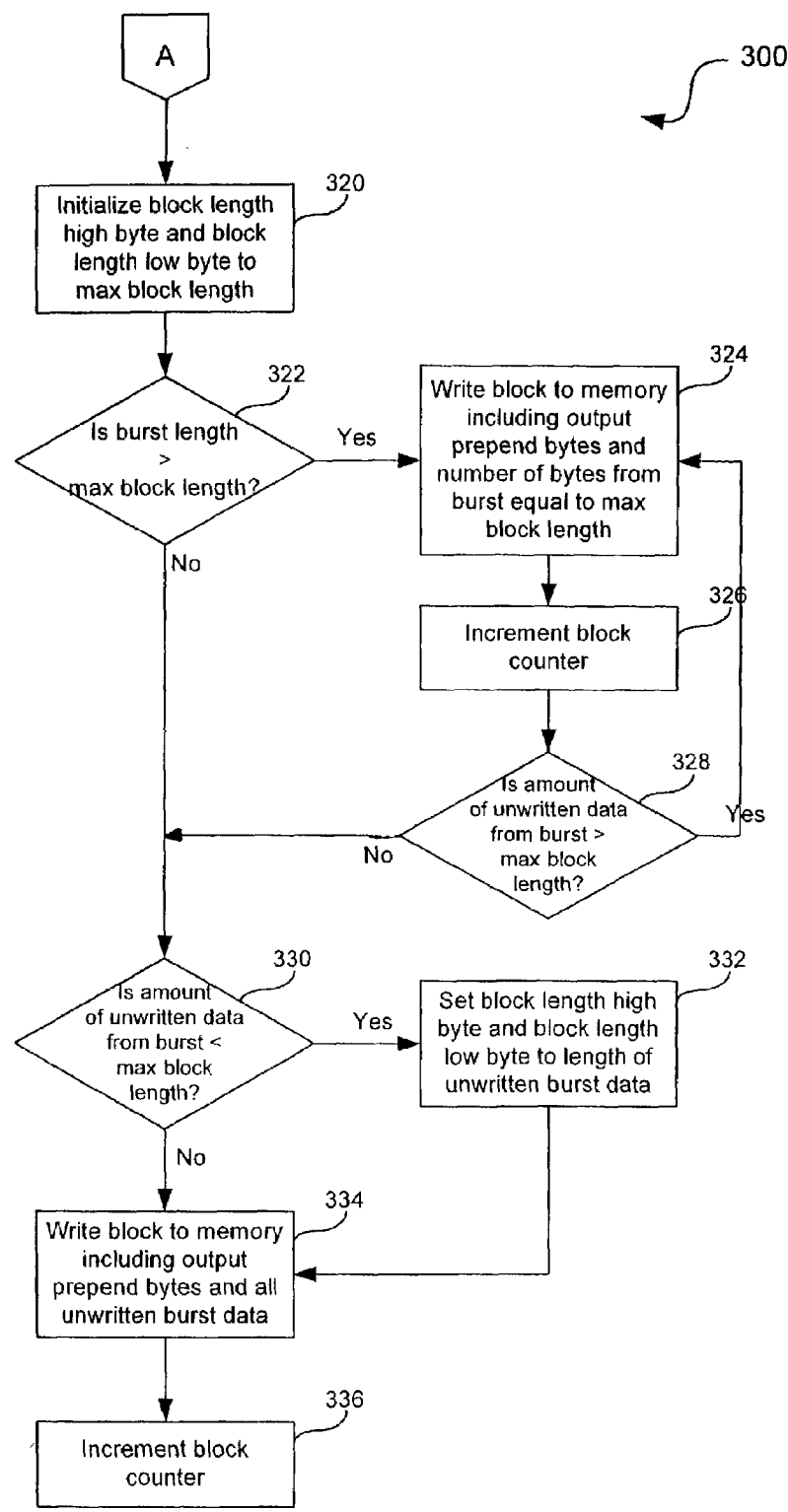
Figure 3C:
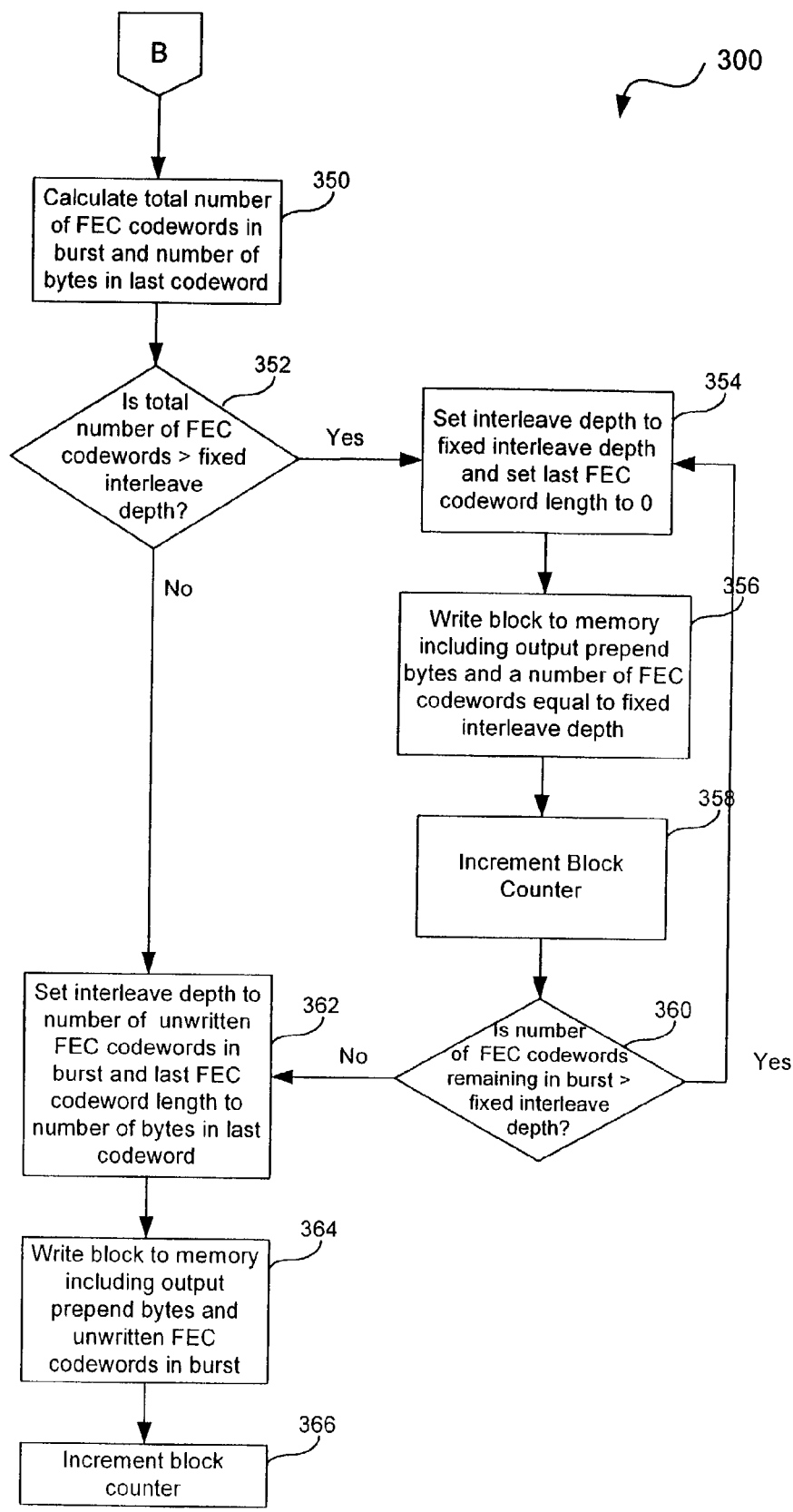
Figure 3D:
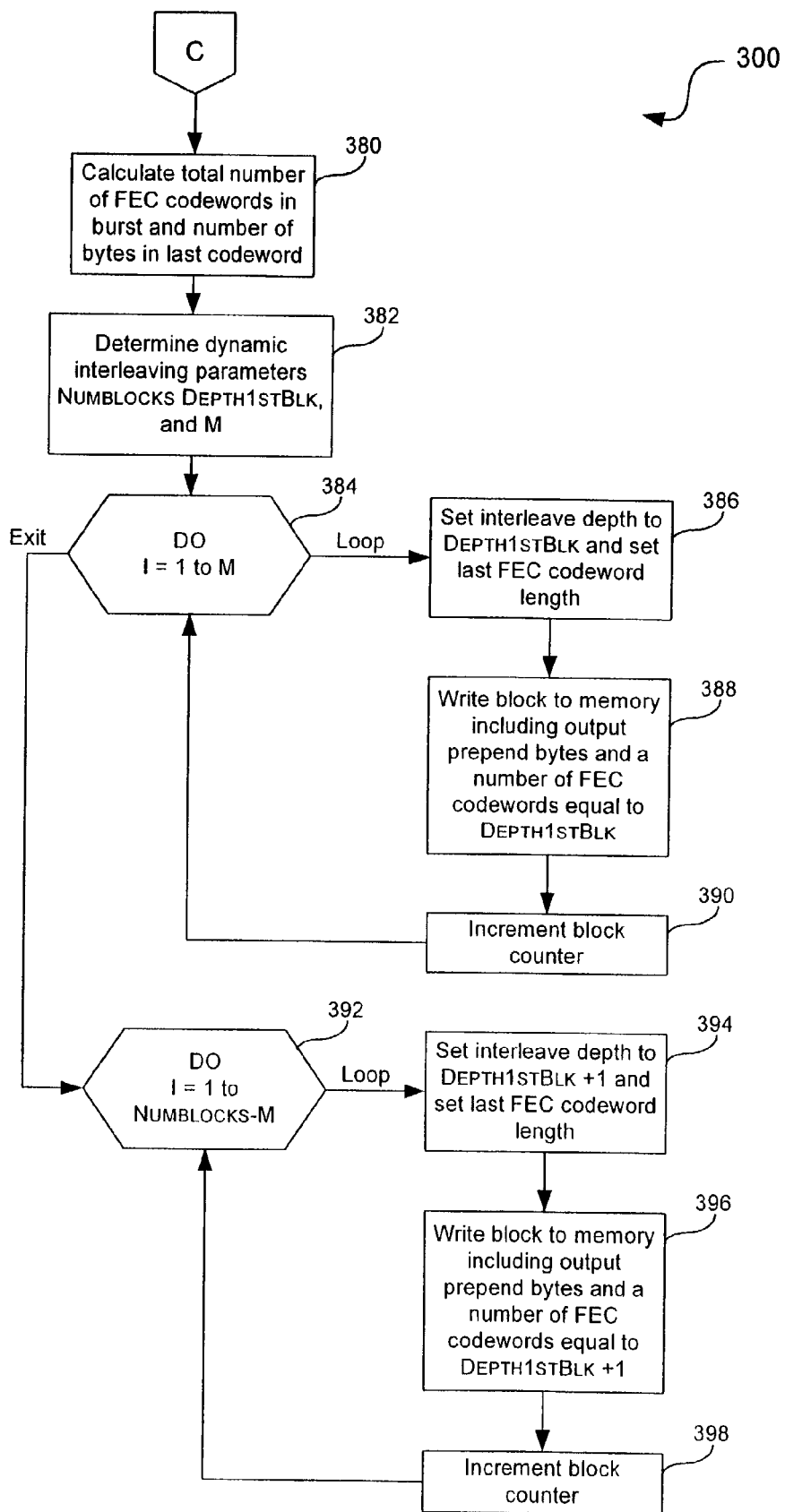

A. System for Interleaving Data in Accordance with Embodiments of the Present Invention FIG. 2 illustrates a system for interleaving data in accordance with an embodiment of the present invention. FIG. 2 will be used to describe the structure and operation of system 200. Subsequent figures will describe timing and a greater level of detail of operation of system 200. System 200 may be implemented in the transmitter portion of a cable modem, a cable modem termination system (CMTS), or other communication device. Persons skilled in the relevant art(s) will recognize that configurations and arrangements other than those provided in FIG. 2 can be used without departing from the spirit and scope of the present invention.

System 200 is intended to be used to interleave data in a communication device (for example, a modem or a CMTS) to reduce the effects of burst errors. Preferably, system 200 may be used in conjunction with an FEC error correction technique to mitigate data errors in a burst of data to be transmitted from a communication device. For example, a Reed Solomon algorithm may be employed with system 200 to mitigate errors in a burst of data transmitted, from the communication device. As will be appreciated by persons skilled in the relevant art(s), the effect of burst or impulse noise on consecutive bytes of data in an RS codeword may be mitigated by interleaving the data.

Figure 1:
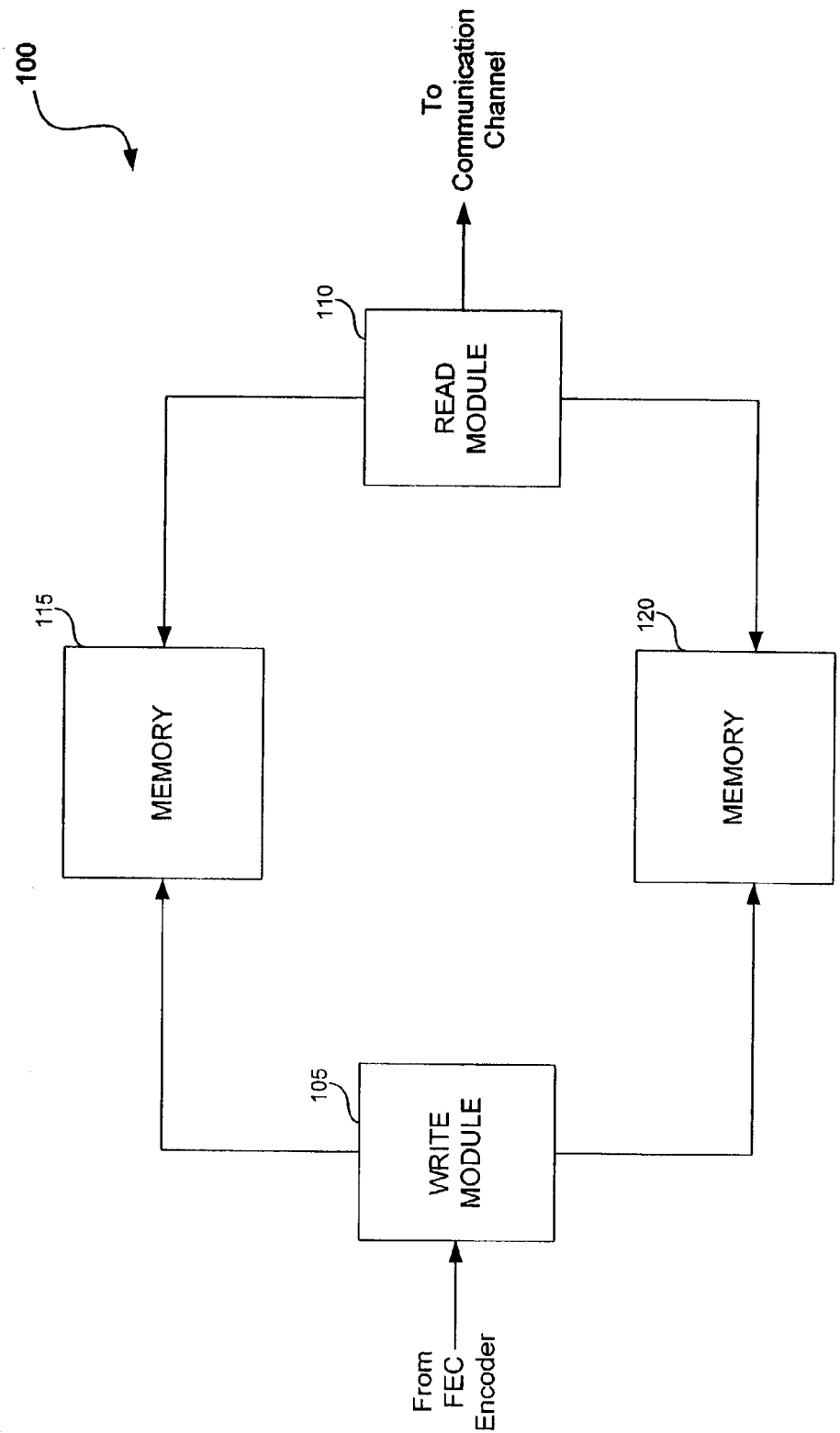
FIG. 1 illustrates a conventional system for interleaving data in a communication device.

System 200 provides a particular advantage where data to be interleaved may be partitioned into variable-sized blocks. This is because, unlike the conventional system described in FIG. 1 above, system 200 is adapted to permit as many blocks of data to be written to memory as can be accommodated therein and to permit as many blocks of data to be read, and optionally interleaved, as are available in memory. Thus, system 200 of FIG. 2 will offer better throughput than system 100 of FIG. 1.

System 200 comprises a plurality of burst profile banks 205a–205n, a write module 210, a memory 215, a read module 220, a block available signal 225, a block out signal 230, and a clear read pointer 235. Write module 210 and read module 220 are each coupled to memory 215 and to burst profile banks 205a–205n. Write module 210 and read module 220 are also connected by signal lines that carry block available signal 225, block out signal 230, and a bus that carries clear read pointer 235.

Each of the burst profile banks 205a–205n includes a plurality of registers for storing a set of burst attributes corresponding to a different burst profile. Each burst transmitted in a cable modem system will adhere to a particular burst profile. Attributes associated with a burst profile may include, but are not limited to, a maximum burst length, an FEC codeword length, a number of parity bytes in an FEC codeword, an interleaver block size, a byte depth for an interleaver block, and a length of the last codeword in an interleaver block. In an embodiment of the present invention, there are a total of eight burst profile banks.

Write module 210 comprises logic configured to receive bursts of data and write the data in discrete blocks to memory 215 so that it may be interleaved prior to transmission over a communication channel. Although write module 210 is preferably implemented in hardware, persons skilled in the relevant art(s) will appreciate that the functions of write module 210 may be implemented entirely in software, or as a combination of hardware and software. Write module 210 may receive bursts of data from an FEC encoder, such as from a Reed-Solomon encoder. In an embodiment, write module 210 includes an input FIFO for temporarily storing received bursts.

As will be discussed in more detail herein, write module 210 also passes important control information to read module 220 that enables the read logic to determine whether a block of data should be interleaved, in what manner it should be interleaved, and when it may be accessed. For example, write module 210 indicates to read module 220 when a block of data may be accessed by asserting block available signal 225. In an embodiment, write module 210 maintains a block counter that is used to determine when to assert block available signal 225. The communication of such control information facilitates the sharing of memory 215 by write module 210 and read module 220.

As shown in FIG. 2, write module 210 and read module 220 each have access to the plurality of burst profile banks 205a–205n. As will be described in more detail below, control information that is received by write module 210 with each burst and passed to read module 220 includes a burst profile bank indicator. By accessing the burst profile bank indicated by the burst profile bank indicator, write module 210 and read module 220 can access additional information about how to treat a particular burst, such as whether or not the burst data should be interleaved.

Memory 215 stores blocks of data written by write module 210 for interleaving by read module 220. Preferably, memory 215 is logically arranged as a circular buffer in which read and write accesses progress sequentially from a first memory address to a last memory address, wrapping around to the first memory address after the last memory address has been reached. In accordance with the use of the circular buffer arrangement, write and read accesses to memory 215 may occur sequentially such that write module 210 need not calculate where to write the next block of data in memory and read module 220 need not calculate where to read the next block of data in memory.

In an embodiment, memory 215 comprises a 4K×8 bit (i.e., a 4K byte) random access memory (RAM). For example, memory 215 may comprise any type of RAM including, but not limited to, a Static Random Access Memory (SRAM), Dynamic Random Access Memory (DRAM), Fast Page Mode Dynamic Random Access Memory (FPM DRAM), Extended Data-out Dynamic Random Access Memory (EDO DRAM), and Synchronous Dynamic Random Access Memory (SDRAM). However, the invention is not limited to the use of a RAM, and memory 215 may also comprise any type of memory device that provides for the temporary storage of data.

Read module 220 comprises logic that is configured to read the blocks of data written to memory 215 in an interleaved fashion for transmission over a communication channel. Although read module 220 is preferably implemented in hardware, persons skilled in the relevant art(s) will appreciate that the functions of read module 220 may be implemented entirely in software, or as a combination of hardware and software. Read module 220 utilizes control information provided by write module 210 to determine whether a block of data should be interleaved, in what manner it should be interleaved, and when it may be accessed. Read module 220 also provides control information to write module 210 that indicates when a block of data has been read from memory 215, via block out signal 230, and what portions of memory 215 are safe for writing to, via clear read pointer 235. The communication of this additional control information further facilitates the sharing of memory 215 by write module 210 and read module 220.

B. Method for Interleaving Data in Accordance with Embodiments of the Present Invention FIGS. 3A, 3B, 3C, and 3D collectively depict a flowchart 300 of a method for writing blocks of data into a memory in accordance with an embodiment of the present invention. The invention, however, is not limited to the description provided by the flowchart 300. Rather, it will be apparent to persons skilled in the relevant art(s) from the teachings provided herein that other functional flows are within the scope and spirit of the present invention. The flowchart 300 will be described with continued reference to the example system 200 for interleaving data described in reference to FIG. 2, above. However, the invention is not limited to that embodiment.

The method of flowchart 300 begins at step 302, in which write module 210 receives a burst of data and corresponding control information preferably comprising three input prepend bytes. In an embodiment, the burst data and input prepend bytes are received over a data bus, such as an 8-bit data bus, from an FEC encoder coupled to write module 210. In accordance with such an embodiment, the receipt of burst data and input prepend bytes by write module 210 is facilitated through the assertion of three control signals by the FEC encoder: a Start of Cell (SOC) signal, an End of FEC Block (EOFECBlk) signal, and an End of Burst (EOB) signal, (not shown in FIG. 2). The FEC encoder asserts the SOC signal when transmitting the input prepend bytes, the EOFECBlk signal when transmitting the last byte of a set of FEC parity bytes (only if FEC is turned on), and the EOB signal when transmitting the last byte of the burst data. These control signals are received by write module 210 and permit write module 210 to delineate input prepend bytes, FEC codewords, and burst data.

In an embodiment, the burst data and corresponding input prepend bytes received in step 302 are temporarily stored in an input FIFO within write module 210. The input FIFO serves as a buffering mechanism for write module 210.

The three input prepend bytes received in step 302 are preferably formatted in accordance with exemplary formats 400A, 400B, and 400C illustrated in FIGS. 4A, 4B, and 4C, respectively, and are prepended to each burst of data received by write module 210.

As shown in FIG. 4A, the five most significant bits of a first input prepend byte in accordance with format 400A comprise a rolling burst count and the three least significant bits comprise a burst profile bank indicator. In accordance with this format, the rolling burst count contains a number equivalent to 1–31 decimal that uniquely identifies the burst received in step 302. Also in accordance with this format, the burst profile indicator contains a number equivalent to 0–7 decimal that uniquely identifies one of eight burst profile banks associated with the burst received in step 302. As discussed above in reference to FIG. 2, each burst profile bank comprises a set of registers that store a set of burst attributes, also called a burst profile, associated with a given burst.

As shown in FIGS. 4B and 4C, a second and third input prepend byte in accordance with formats 400B and 400C comprise a burst length high byte and a burst length low byte, respectively. Together, these bytes define the length of the burst received by write module 210 in step 302. In an embodiment of the present invention, the byte length defined by the second and third input prepend bytes will be equal to the byte length of the burst received in step 302 less the length of a burst preamble in an instance where FEC was applied to the burst data, and will be equal to zero in an instance where FEC was not applied to the burst data. In the latter case, the write module 210 implements a counter to determine the byte length of the burst data received in step 302 when the burst data is initially received.

As will be described in more detail immediately below, write module 210 divides the burst received in step 302 into one or more blocks in accordance with one of three techniques: (1) no interleaving, (2) fixed interleaving, or (3) dynamic interleaving. No matter which technique is used, write module 210 writes each block to memory along with a set of three output prepend bytes. The three output prepend bytes are preferably formatted in accordance with exemplary formats 500A, 500B, and 500C illustrated in FIGS. 5A, 5B, and 5C, respectively, and are prepended to each block of data written to memory 215 by write module 210.

As shown in FIG. 5A, a first output prepend byte formatted in accordance with format 500A is identical to that of an input prepend byte formatted in accordance with format 400A in that the five most significant bits comprise a rolling burst count and the three least significant bits comprise a burst profile bank indicator. As shown in FIG. 5B, a second output prepend byte in accordance with format 500B comprises either a block length high byte, if interleaving is not active, or an interleave depth if interleaving is active. As shown in FIG. 5C, a third output prepend byte formatted in accordance with format 500C comprises either a block length low byte, if interleaving is not active, or a last FEC codeword length, if interleaving is active. The use of these output prepend bytes will be explained in more detail below.

Returning to the description of the method depicted by flowchart 300, processing continues at step 304 (FIG. 3A) in which write module 210 copies the rolling burst count and the burst profile bank indicator from the first input prepend byte to the first output prepend byte. This step assures that each block of data written to memory 215 by write module 210 will be associated with the same rolling burst count and burst profile bank as the burst from which it originated.

At step 306, the write module 210 accesses the burst profile bank from among the plurality of burst profile banks 205a–205n that is uniquely identified by the burst profile bank indicator from the first input prepend byte. By accessing burst profile information from the appropriate burst profile bank, the write module 210 determines if interleaving applies to the burst or not, as indicated by decision step 308.

If interleaving is turned off, processing branches to step 320 (FIG. 3B), in which write module 210 initializes the block length high byte of the second output prepend byte and the block length low byte of the third output prepend byte to a predetermined maximum value. The block length high byte and the block length low byte specify the byte length of a block written to memory 215 in an instance where interleaving is turned off. In an embodiment, the write module 210 initializes the block length high byte and the block length low byte to a value equivalent to 2048 decimal, which corresponds to half the capacity of memory 215 when memory 215 comprises a 4 k byte RAM.

As indicated at decision step 322, write module 210 then determines if the byte length of the burst (as provided in the second and third input prepend bytes) exceeds the predetermined maximum block length. If so, write module 210 writes a block of data to memory that includes the three output prepend bytes along with a number of bytes from the burst data that is equal to the maximum block length. For reasons that will be described below, whenever write module 210 writes a block to memory 215 it also increments a block counter by one, as exemplified by processing step 326.

At decision step 328, write module 210 then determines if the amount of unwritten data remaining in the burst still exceeds the maximum block length. If so, then steps 324 and 326 are repeated until such time as the amount of unwritten data in the burst is less than or equal to the maximum block length, in which case processing continues at step 330. Processing also proceeds directly from step 322 to step 330 when the original burst length is less than or equal to the predetermined maximum block length.

At step 330, write module 210 determines if the amount of unwritten data remaining in the burst is less than the predetermined maximum block length. If it is, then write module 210 sets the block length high byte and the block length low byte equal to the actual number of unwritten bytes remaining in the burst, as shown at step 332. Otherwise, these fields will remain initialized to the predetermined maximum block length. At step 334, write module 210 writes a block to memory that includes the three output prepend bytes along with all unwritten bytes of data from the burst, and at step 336, write module 210 increments the block counter accordingly.

Returning to decision step 308 (FIG. 3A), if interleaving applies to the burst, then write module 210 uses information from the burst profile bank accessed in step 306 to determine if fixed interleaving applies, as indicated by decision step 310. In a fixed interleaving mode, each block that write module 210 writes to memory 215 will have the same number of FEC codewords, which is also referred to as the interleave depth of the block. The last block of the burst, however, can contain fewer FEC codewords if the burst does not contain enough codewords to fill the last block. The interleave depth is specified in the burst profile and may be accessed by write module 210 as part of previously-described step 306.

If fixed interleaving applies to the burst, then processing branches to step 350 (FIG. 3C), in which write module 210 calculates the total number of FEC codewords in the burst as well the number of bytes in the last FEC codeword of the burst. The number of bytes in the last FEC codeword is calculated in order to support a type of interleaving that allows for shortened last FEC codewords, as will be described in more detail below with reference to FIG. 6, and as will be appreciated by persons skilled in the relevant art(s). To perform these calculations, write module 210 uses the byte length of the burst as provided in the second and third input prepend bytes as well as an FEC codeword length specified in the burst profile and accessed by write module 210 as part of previously-described step 306.

At decision step 352, write module 210 compares the total number of FEC codewords in the burst to the fixed interleave depth associated with the burst. As mentioned above, the write module 210 obtains the fixed interleaved depth from the burst profile bank accessed in step 306. If the total number of FEC codewords in the burst exceeds the fixed interleave depth, then write module 210 sets the interleave depth in the second output prepend byte to the fixed interleave depth and sets the last FEC codeword length in the third output prepend byte to zero, as indicated at step 354. At step 356, write module 210 then writes a block of data to memory that includes the three output prepend bytes and a number of FEC codewords from the burst that is equal to the fixed interleave depth. At step 358, write module 210 increments the block counter by one to account for the writing of a block during step 356.

At decision step 360, write module 210 then determines if the number of unwritten FEC codewords remaining in the burst still exceeds the fixed interleave depth. If so, steps 356 and 358 are repeated until such time as the number of unwritten FEC codewords remaining in the burst is less than or equal to the fixed interleave depth, in which case processing continues at step 362. Processing also proceeds directly from step 352 to step 362 when the total number of FEC codewords in the original burst is less than or equal to the fixed interleave depth.

At step 362, write module 210 sets the interleave depth in the second output prepend byte to the number of unwritten FEC codewords remaining in the burst and sets the last FEC codeword length in the third output prepend byte to the number of bytes in the last codeword as calculated in prior step 350. At step 364, write module 210 writes a block to memory that includes the three output prepend bytes along with all unwritten FEC codewords in the burst, and at step 336, write module 210 increments the block counter accordingly.

Returning to decision step 310 (FIG. 3A), if fixed interleaving does not apply to the burst, then write module 210 uses information from the burst profile bank accessed in step 306 to determine if dynamic interleaving applies, as indicated by decision step 312. In a dynamic interleaving mode, the interleaver depth for each block written to memory 215 is based on the size of the burst, and may vary between blocks generated from the same burst. Dynamic interleaving may be desirable in situations where optimal interleaving cannot be achieved with fixed interleaving operations. For example, assume that a burst has five FEC codewords. In a fixed interleaving mode with an interleave depth of four, a block comprising the first four FEC codewords will be interleaved. However, the fifth FEC codeword cannot be interleaved, as there are no other codewords with which to interleave it.

In a dynamic interleaving operating mode, this undesirable result can be prevented. Again, assume that a burst has five FEC codewords. In accordance with dynamic interleaving, an interleave depth of two is applied to the burst, resulting in the interleaving of a block comprising the first two FEC codewords, and then an interleave depth of three is applied so that a block comprising the last three FEC codewords in the burst will be interleaved. Thus, every FEC codeword in the burst may be interleaved and the undesirable result described above is prevented.

If dynamic interleaving applies to the burst, then processing branches to step 380 (FIG. 3D), in which write module 210 calculates the total number of FEC codewords in the burst as well the number of bytes in the last FEC codeword of the burst. As mentioned above, the number of bytes in the last FEC codeword is calculated in order to support a type of interleaving that allows for shortened last FEC codewords, as will be described in more detail below with reference to FIG. 6, and as will appreciated by persons skilled in the relevant art(s). To perform these calculations, write module 210 uses the byte length of the burst as provided in the second and third input prepend bytes as well as an FEC codeword length specified in the burst profile and accessed by write module 210 as part of previously-described step 306.

At step 382, write module 210 uses the total number of FEC codeword in the burst as calculated in step 380 to determine various dynamic interleaving parameters that will be applied to the burst. These parameters include the number of blocks for the burst (NUMBLOCKS), the interleave depth of the first block (DEPTH1STBLK), and the number of blocks that will be of length DEPTH1STBLK (M). The necessary calculations for determining these parameters are well-known in the art. For example, see Section 6.2.6 of the Data-Over-Cable Service Interface Specifications (DOCSIS) Radio Frequency Interface Specification SPI-RFIv2.0-I01-011231, published by Cable Televesion Laboratories, Inc., incorporated by reference in its entirety herein.

Write module 210 then writes M blocks to memory 215, each with an interleave depth of DEPTH1STBLK. In flowchart 300, this process is represented by the do loop initiated at step 384. During each of the M iterations of this loop, write module 210 performs steps 386, 388 and 390. At step 386, write module 210 sets the interleave depth of the second output prepend byte to DEPTH1STBLK and assigns a value to the last FEC codeword length of the third output prepend byte. The last FEC codeword length is set to zero in all cases except where the last of the M blocks is being written and M=NUMBLOCKS, in which case the last FEC codeword length is set to the number of bytes in the last FEC codeword of the burst as calculated in prior step 380. At step 388, write module 210 writes a block to memory 215 that includes the three output prepend bytes and a number of unwritten FEC codewords from the burst equal to DEPTH1STBLK. At step 390, write module 210 increments the block counter by one to account for the block written in prior step 388.

After the do loop of step 384 completes, write module 210 then writes NUMBLOCKS—M blocks to memory 215, each with an interleave depth of DEPTH1STBLK+1. In flowchart 300, this process is represented by the do loop initiated at step 392. During each of the NUMBLOCKS—M iterations of this loop, write module 210 performs steps 394, 396, and 398. At step 394, write module 210 sets the interleave depth of the second output prepend byte to DEPTH1STBLK+1 and assigns a value to the last FEC codeword length of the third output prepend byte. The last FEC codeword length is set to zero in all cases except where the last of the NUMBLOCKS—M blocks is being written, in which case the last FEC codeword length is set to the number of bytes in the last FEC codeword of the burst as calculated in prior step 380. At step 396, write module 210 writes a block to memory 215 that includes the three output prepend bytes and a number of unwritten FEC codewords from the burst equal to DEPTH1STBLK+1. At step 398, write module 210 increments the block counter by one to account for the block written in prior step 396.

As noted throughout flowchart 300, each time a block is written into memory 215, write module 210 increments a block counter by one. As will be discussed in more detail below with respect to FIG. 6, write module 210 also decrements the block counter by one every time a block out signal 230 is received from read module 220, the assertion of which indicates that read module 220 has finished reading a block from memory 215. Thus, the block counter indicates how many unread blocks reside in memory 215 at any given point in time. Whenever the block counter holds a value greater than zero, the write module 210 asserts block available signal 225, which indicates to read module 220 that at least one block of data is available to be read from memory 215.

FIG. 6 depicts a flowchart 600 of a method for reading and interleaving blocks of data from a memory in accordance with an embodiment of the present invention. The invention, however, is not limited to the description provided by the flowchart 600. Rather, it will be apparent to persons skilled in the relevant art(s) from the teachings provided herein that other functional flows are within the scope and spirit of the present invention. The flowchart 600 will be described with continued reference to the example system 200 for interleaving data described in reference to FIG. 2, above. However, the invention is not limited to that embodiment.

The method of flowchart 600 begins at decision step 602, in which read module 220 determines whether block available signal 225 is asserted. If block available signal 225 is not asserted, then there are no blocks available to be read from memory 215 and read module 220 goes idle until the next block becomes available. However, if block available signal 225 is asserted, then there is a block available to be read from memory 215, and read module 220 reads the three output prepend bytes included with the next block of data in memory, as indicated at step 604. As discussed above, the three output prepend bytes are preferably formatted in accordance with the exemplary formats 500A, 500B and 500C depicted in FIGS. 5A, 5B, and 5C, respectively.

At decision step 606, read module 220 compares the first output prepend byte from the next block of data in memory 215 to the first output prepend byte from the previously read block to determine if they are the same. If they are the same, then the next block of data in memory 215 is part of the same burst as the previously read block of data and processing proceeds to step 610. If they are not the same, then the next block of data in memory 215 is from a new burst, and the previously read block of data is the last of a complete burst. Accordingly, read module 220 may output the complete burst for transmission over a communication channel as indicated at step 608, prior to proceeding to step 610.

In an embodiment, read module 220 transmits the complete burst to a synchronous FIFO interface (not shown in FIG. 2). To facilitate this transmission, read module 220 asserts a start of burst (OFSOB) flag when transmitting the first byte of data in the burst and an end of burst (OFEOB) flag when transmitting the last byte of data in the burst, each of which is received by the synchronous FIFO interface. To further facilitate this transmission, the synchronous FIFO interface asserts an "almost full" signal when the synchronous FIFO interface is one byte away from being completely full, and a "full" signal when the synchronous FIFO is completely full. When read module 220 detects the "almost full" flag, it stops transmitting data to the synchronous FIFO interface after writing the current byte. Read module 220 will then wait for the "full" flag to be de-asserted before it begins transmitting data again.

In a further embodiment, when read module 220 is ready to transmit a complete burst, it outputs the first output prepend byte (which comprises the rolling burst count and burst profile bank indicator associated with the burst) on an 8-bit bus to a communication processor block (not shown in FIG. 2), which controls the timing of transmissions over the communication channel. The communication processor block then asserts a transmit now (TxNow) signal to initiate transmission of the burst from read logic 220. The communication processor block can use the information on the 8-bit bus to determine if the burst that read module 220 is ready to transmit is the same burst that is desired to transmit. In accordance with this further embodiment, read module 220 only outputs a non-zero value on the 8-bit bus between when it is ready to transmit a complete burst and when TxNow is asserted. Accordingly, the communication processor block can also check for a value of zero on the bus as an indication that read module 220 is not ready to begin the transmission. The detection of an incorrect burst, or an indication that a burst that is not ready for transmission when it should be, represent error conditions that may be handled by the communication processor block.

Returning to the description of the method depicted by flowchart 600, processing continues at step 610, in which read module 220 accesses the burst profile bank from among the plurality of burst profile banks 205a–205n that is uniquely identified by the burst profile bank indicator from the first output prepend byte. By accessing burst profile information from the appropriate burst profile bank, the read module 220 determines if interleaving applies to the block or not, as indicated by decision step 612.

If interleaving does not apply to the block, then processing branches to step 614, in which read module 220 determines the block length in bytes of the next block in memory 215 by combining the block length high byte from the second output prepend byte and the block length low byte from the third output prepend byte. Read module 220 then reads a number of bytes from memory 215 equal to the block length in a non-interleaved fashion. In other words, read module 220 reads the bytes from memory 215 in the same order in which they were written to memory 215.

As read module 220 reads bytes of data from memory 215, it periodically increments clear read pointer 235, as indicated at step 618. The value of clear read pointer 235 is the memory address below which all data has been read, and below which write module 210 may write new data. As illustrated in FIG. 2, clear read pointer 235 is provided on a bus from read module 220 to write module 210. Although steps 616 and step 618 are depicted as separate steps in flowchart 600, they are preferably executed concurrently, such that clear read pointer 235 may be updated as one or more bytes of data are being read from memory 215, rather than only after an entire block of data has been read.

After read module 220 has completed reading the block of data from memory 215 in a non-interleaved fashion, it asserts block out signal 230, which indicates to the write module 210 that a complete block of data has been read from memory 215. This is shown at step 620. The assertion of block out signal 230 causes write module 210 to decrement its block counter, which is used to determine how many unread blocks of data reside in memory 215 at any given point in time, as discussed above.

Returning now to decision step 612, if either fixed or dynamic interleaving applies to the next block of data in memory 215, then processing branches to step 622, in which read module 220 determines the interleave depth of the block and the length of the last FEC codeword in the block by reading the second and third output prepend bytes, respectively. Then, at step 624, read module 220 reads the block of data from memory in an interleaved fashion in accordance with the interleave depth and last FEC codeword length determined in prior step 622.

FIG. 7 is a diagram 700 that may be used to illustrate the interleaving of exemplary blocks of data by read module 220 in accordance with embodiments of the present invention. In accordance with FIG. 7, assume that write module 210 has written a burst of data into memory 215 in a row-wise fashion, resulting in the creation of five rows 701 through 705, wherein each of rows 701, 702, 703 and 704 represents a separate FEC codeword of length N and row 705 represents an FEC codeword of length k. Note that the division of the data into rows is a logical construct, and may bear no relation to the physical layout of memory addresses in memory 215. Also assume that the fixed interleave depth for the burst, based on the burst profile, is three. Thus, in accordance with the method described above in reference to flowchart 300, the first block would comprise rows 701, 702 and 703, and would have an interleave depth of three and a last FEC codeword length of zero (indicating no shortened last FEC codeword). Read module 220 would then read the first block out of memory 215 in column-wise fashion starting with X11, then X21, X31, X12, X22, and so on until X3N.

The second block would comprise rows 704 and 705. In accordance with the method described above in reference to flowchart 300, the second block would have a rolling burst count and a burst profile indicator that is identical to that of the first block. This indicates to read module 220 that the second block is a continuation of the burst from the first block. Also, in accordance with the method described above in reference to flowchart 300, the second block would have an interleave depth of two and a last FEC codeword length of k. These values indicate to read module 220 that the second block is to be interleaved with a depth of two with a last FEC codeword shortened to k bytes. As a result, read module 220 will read the second block out of memory 215 in column-wise fashion starting with X41, then X51, X42, X52, X43, . . . X4k, X5k, X41, X4m, . . . X4N.

The above example of interleaving in accordance with embodiments of the present invention has been provided for illustrative purposes only. Interleaving algorithms, including algorithms for interleaving data with a shortened last FEC codeword, are well-known in the art. For example, see Section 6.2.6 of the Data-Over-Cable Service Interface Specifications (DOCSIS) Radio Frequency Interface Specification SPI-RFIv2.0-I01-011231, published by Cable Televesion Laboratories, Inc., incorporated by reference in its entirety herein.

As read module 220 reads bytes of data from memory 215 in an interleaved fashion, it periodically increments clear read pointer 235, as indicated at step 626. The value of clear read pointer 235 is the memory address below which all data has been read, and below which write module 210 may write new data. As illustrated in FIG. 2, clear read pointer 235 is provided on a bus from read module 220 to write module 210. In the case where a block of data is being interleaved, the maintenance of clear read pointer 235 is particularly critical, as the real read address jumps around within the data block. In the interleaving example discussed above in reference to FIG. 7, X11 and X21 are the first two data bytes read out of memory 215. Even though the read address is pointing to X21, the data between X12 and X1N has not been read yet. Thus, it is permissible for write module 210 to write over X11, but it is not permissible to write any further. When interleaving is activated, read module 220 increments clear read pointer 235 along the tops of the columns as each column has been completely read. When read module 220 is reading the last column, clear read pointer 235 is incremented to jump down the column as it is read. Thus, with further reference to the example of FIG. 7, as read module 220 reads the first block from memory 215, clear read pointer 235 will sequence through X11, X12, X12, . . . X1N, X2N, and X3N.

Accordingly, although steps 624 and step 626 are depicted as separate steps in flowchart 600, they are preferably executed concurrently, such that clear read pointer 235 may be updated as each column of data is being read from a block in memory 215, rather than only after an entire block of data has been read.

After read module 220 has completed reading the block of data from memory 215 in an interleaved fashion, it asserts block out signal 230, which indicates that to write module 210 that a complete block of data has been read from memory 215. This is shown at step 628. The assertion of block out signal 230 causes write module 210 to decrement its block counter, which is used to determine how many unread blocks of data reside in memory 215 at any given point in time, as discussed above.

C. Conclusion

While various embodiments of the present invention have been described above, it should be understood that they have been presented by way of example, and not limitation. It will be apparent to persons skilled in the relevant art(s) that various changes in form and detail can be made therein without departing from the spirit and scope of the invention. Thus, the present invention should not be limited by any of the above-described exemplary embodiments, but should be defined only in accordance with the following claims and their equivalents.

What is claimed is:

1. A system for interleaving data in a communication device, comprising:
a memory;
a write module coupled to said memory via a first communication path, said write module configured to write a block of data to said memory; and
a read module coupled to said memory via a second communication path, said read module configured to read said block of data from said memory in an interleaved fashion;
wherein said write module is further configured to provide control information to said read module, said control information including an interleave depth of said block of data, and to provide a block available signal to said read module indicating that said block of data is available to be read, and
wherein said read module is further configured to receive said control information and to read said block of data from said memory in an interleaved fashion in accordance with said interleave depth upon receiving said block available signal.

2. The system of claim 1, wherein the communication device comprises a cable modem.

3. The system of claim 1, wherein the communication device comprises a cable modem termination system.

4. The system of claim 1, wherein said write module is configured to provide said control information to said read module by prepending said control information to said block of data written to said memory.

5. The system of claim 1, wherein said memory comprises a random access memory.

6. The system of claim 1, wherein said memory is logically arranged as a circular buffer.

7. The system of claim 1, wherein said write module is further configured to receive a burst of data and to generate said block of data from said burst.

8. The system of claim 7, wherein said control information further includes an identifier that uniquely identifies said burst.

9. The system of claim 7, wherein said control information further includes an indicator that is used by said read module to access burst profile information associated with said burst.

10. The system of claim 1, wherein said control information further includes a shortened last codeword size for said block of data.

11. The system of claim 1, wherein said block of data comprises a plurality of forward error correction (FEC) codewords.

12. The system of claim 1, wherein said write module is further configured to determine said interleave depth for said block of data in accordance with a dynamic interleaving algorithm.

13. The system of claim 1, wherein said read module maintains a pointer, said pointer indicating an address in said memory below which said write module can write said block of data without overwriting unread data.

14. A system for interleaving data in a communication device, comprising:
   a memory;
   a write module coupled to said memory via a first communication path, said write module configured to write a block of data to said memory and to access burst profile information to determine if said block of data should be interleaved; and
   a read module coupled to said memory via a second communication path, said read logic configured to read said block of data from said memory and to access said burst profile information to determine if said block of data should be interleaved;
   wherein said write module is further configured to provide control information to said read module, said control information including an interleave depth if said block of data should be interleaved or a block length if said block of data should not be interleaved, and to provide a block available signal to said read module indicating that said block of data is available to be read, and
   wherein said read module is further configured to read said block of data from said memory upon receiving said block available signal, wherein said block of data is read in an interleaved fashion in accordance with said interleave depth if said block of data should be interleaved and said block of data is read in a non-interleaved fashion in accordance with said block length if said block of data should not be interleaved.

15. The system of claim 14, wherein the communication device comprises a cable modem.

16. The system of claim 14, wherein the communication device comprises a cable modem termination system.

17. The system of claim 14, wherein said write module is configured to provide said control information to said read module by prepending said control information to said block of data written to said memory.

18. The system of claim 14, wherein said memory comprises a random access memory.

19. The system of claim 14, wherein said memory is logically arranged as a circular buffer.

20. The system of claim 14, wherein said write module is further configured to receive a burst of data and to generate said block of data from said burst.

21. The system of claim 20, wherein said control information further includes an identifier that uniquely identifies said burst.

22. The system of claim 14, wherein said control information further includes an indicator that is used by said read module to access said burst profile information.

23. The system of claim 14, wherein said control information further includes a shortened last codeword size for said block of data if said block of data should be interleaved.

24. The system of claim 14, wherein said write module is further configured to determine said interleave depth for said block of data in accordance with a dynamic interleaving algorithm if said block of data should be interleaved.

25. The system of claim 14, wherein said read module maintains a pointer, said pointer indicating an address in said memory below which said write module can write said block of data without overwriting unread data.

* * * * *